United States Patent
Kasa et al.

[11] Patent Number: 6,125,055
[45] Date of Patent: Sep. 26, 2000

[54] SECTOR WRITE PROTECT CAMS FOR A SIMULTANEOUS OPERATION FLASH MEMORY

[75] Inventors: Yasushi Kasa, Kawasaki, Japan; Guowei Wang, San Jose, Calif.

[73] Assignees: Advanced Micro Devices, Inc.; Fujitsu Limited, Japan

[21] Appl. No.: 09/421,105

[22] Filed: Oct. 19, 1999

[51] Int. Cl.[7] .................................................. G11C 16/04
[52] U.S. Cl. ............................... 365/185.04; 365/185.11; 365/189.04; 365/230.03
[58] Field of Search .......................... 365/185.04, 185.11, 365/189.04, 230.03, 230.06

[56] References Cited

U.S. PATENT DOCUMENTS

| | | | |
|---|---|---|---|
| 5,263,000 | 11/1993 | Van Buskirk et al. | 356/226 |
| 5,291,446 | 3/1994 | Van Buskirk et al. | 365/189.09 |
| 5,612,921 | 3/1997 | Chang et al. | 365/226 |
| 5,708,387 | 1/1998 | Cleveland et al. | 327/536 |
| 5,841,696 | 11/1998 | Chen et al. | 365/185.11 |
| 5,847,998 | 12/1998 | Van Buskirk | 365/185.33 |
| 5,867,430 | 2/1999 | Chen et al. | 365/189.04 |
| 6,005,803 | 12/1999 | Kuo et al. | 365/185.11 |
| 6,016,270 | 1/2000 | Thummalapally et al. | 365/185.11 |

OTHER PUBLICATIONS

Intel Corporation, "Common Flash Memory Interface Specification," Release 1.1, May 30, 1997.
AMD, "Common Flash Memory Interface Publication 100—Vendor & Device ID Code Assignments," Jul. 25, 1996, vol. No. 96.1
AMD "AM29DL162C/AM29DL163C 16 Megabit (2 M×8–Bit/1 M×16–Bit) CMOS 3.0 Volt–only, Simultaneous Operation Flash Memory," Publication 21533, Rev: C Amendment/+2, Jun. 14, 1999.
Intel Corporation, "1.8 Volt Intel® Dual–Plane Flash Memory 28F320D18 (×16)," Product Preview Datasheet, Order Number: 290672–002, Oct. 1999.
Macronix International Co., Ltd. "MXIC Advance Information MX29VW160T/B—16M–BIT [2M×8–BIT/1M× 16–BIT] Simultaneous Read/Write Single 2.5V Operation Flash Memory," P/N:PM0567, Rev. 0.8, May 17, 1999.
ATMEL Corporation, "ATMEL® 16–megabit (1M×16/2M× 8) 3–volt Only Flash Memory," Rev. 0925H—Aug. 1999.
STMicroelectronics, "M59DR032A, M59DR032B, 32 Mbit (2Mb×16, Dual Bank, Page) Low Voltage Flash Memory," preliminary data, Oct. 1999, pp. 1–38.
"AMD—Flash Introduction," obtained at the internet address http://www.amd.com/products/nvd/overview/flash intro.html, Apr. 14, 1999.

(List continued on next page.)

*Primary Examiner*—Son T. Dinh
*Attorney, Agent, or Firm*—Brinks Hofer Gilson & Lione

[57] ABSTRACT

A simultaneous operation flash memory capable of write protecting predetermined sectors in the simultaneous operation flash memory. The preferred simultaneous operation flash memory includes a plurality of sectors divided into an upper bank and a sliding lower bank. Each bank is associated with a predetermined amount of sectors in the simultaneous operation flash memory. The simultaneous operation flash memory also includes at least one upper address decoder circuit that has a upper sector select line. During operation, each upper address decoder circuit generates a predetermined output signal on the upper sector select line when selected. In addition, the simultaneous operation flash memory includes at least one lower address decoder circuit including a lower address sector select line, wherein each upper address decoder circuit generates a predetermined output signal on the lower sector select line when selected during operation. Finally, at least one write protect CAM is electrically connected with a respective upper sector select line or a respective lower sector select line, wherein said write protect CAM generates a sector protect signal if the write protect CAM is selected by the respective upper sector select line or the respective lower sector select line.

22 Claims, 6 Drawing Sheets

OTHER PUBLICATIONS

"AMD—Simultaneous Read/Write," obtained at the internet address http://www.amd.com/products/nvd/overview/simuintro.html, Jul. 12, 1999.

"AMD News Release #9879," obtained at the internet address http://www.amd.com/news/prodpr/9879.html.

"Intel® 1.8 Volt Dual–Plane 32–Mbit Flash Memory (D18)," obtained at the internet address http://www.intel.com/design/flcomp/prodbref/298131.htm, Nov. 18, 1999., U.S. Patent Application, Serial No. 09/159,029, filed Sep. 23, 1998.

U.S. Patent Application, Serial No. 09/159,142, filed Sep. 23, 1998.

U.S. Patent Application, Serial No. 09/159,489, filed Sep. 23, 1998.

"Intel Announces 1.8—Volt Dual–Plane Flash Memory" obtained at internet address http://www.intel.com/pressroom/archive/releases/F1092099.htm Nov. 12, 1999.

Brian Dipert and Markus Levy "Designing with Flash Memory—The definitive guide to designing flash memory hardware and software for components and PCMCIA cards," Annabooks, ISBN 0–929392–17–5, Ch. 3, pp. 23–44.

AMD, Technology Background brochure, "3.0 Volt–only Page Mode Flash Memory Technology." 22249A Oct. 1998.

AMD, Technology Background brochure, "3.0 Volt–only Burst Mode Flash Memory Technology," 22250A Oct. 1998.

AMD, Technology Background brochure, "1.8 Volt–only Flash Memory Technology." 21628 A Dec. 1997.

AMD, Technology Background brochure, "AMD DL160 and DL320 Series Flash: New Densities, New Features." 22271 A.

Fig. 2

| Z4 | A20 | A19 | A18 | A17 | A16 | A15 | A12 |
|---|---|---|---|---|---|---|---|
| Z40 | 0 | 0 | 0 | 0 | X | X | X |
| Z41 | 0 | 0 | 0 | 1 | X | X | X |
| Z42 | 0 | 0 | 1 | 0 | X | X | X |
| Z43 | 0 | 0 | 1 | 1 | X | X | X |
| Z44 | 0 | 1 | 0 | 0 | X | X | X |
| Z45 | 0 | 1 | 0 | 1 | X | X | X |
| Z46 | 0 | 1 | 1 | 0 | X | X | X |
| Z47 | 0 | 1 | 1 | 1 | X | X | X |
| Z48 | 1 | 0 | 0 | 0 | X | X | X |
| Z49 | 1 | 0 | 0 | 1 | X | X | X |
| Z410 | 1 | 0 | 1 | 0 | X | X | X |
| Z411 | 1 | 0 | 1 | 1 | X | X | X |
| Z412 | 1 | 1 | 0 | 0 | X | X | X |
| Z413 | 1 | 1 | 0 | 1 | X | X | X |
| Z414 | 1 | 1 | 1 | 0 | X | X | X |
| Z415 | 1 | 1 | 1 | 1 | 0 | 0 | X |
|  |  |  |  |  | 0 | 1 | X |
|  |  |  |  |  | 1 | 0 | X |
|  |  |  |  |  | 1 | 1 | X |
| Z416 | 1 | 1 | 1 | 1 | 1 | 1 | X |
| Z417 | 1 | 1 | 1 | 1 | 1 | 1 | 1 |

| Z3 | A16 | A15 |
|---|---|---|
| Z3(0) | 0 | 0 |
| Z3(1) | 0 | 1 |
| Z3(2) | 1 | 0 |
| Z3(3) | 1 | 1 |

Fig. 3

| WPCAM | ASSIGNED SECTOR |
| --- | --- |
| WPCAM0 | SA0 |
| WPCAMA | SA1–SA3 |
| WPCAMB1 | SA4–SA7 |
| WPCAMB2 | SA8–SA11 |
| WPCAMB3 | SA12–SA15 |
| WPCAMB4 | SA16–SA19 |
| WPCAMB5 | SA20–SA23 |
| WPCAMB6 | SA24–SA27 |
| WPCAMB7 | SA28–SA31 |
| WPCAMC1 | SA32–SA35 |
| WPCAMC2 | SA36–SA39 |
| WPCAMC3 | SA40–SA43 |
| WPCAMC4 | SA44–SA47 |
| WPCAMC5 | SA48–SA51 |
| WPCAMC6 | SA52–SA55 |
| WPCAMC7 | SA56–SA59 |
| WPCAMD | SA60–SA62 |
| WPCAME | SA63 |
| MULTI-SECTOR WPCAM | ss0–ss7 |

Fig. 5

SECTOR WRITE PROTECT CAMS FOR A SIMULTANEOUS OPERATION FLASH MEMORY

FIELD OF THE INVENTION

The present invention relates generally to non-volatile memory devices and, more particularly, to a method and system for making predetermined sectors in a flash electrically erasable programmable memory (EEPROM) read only.

BACKGROUND OF THE INVENTION

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

Flash memories are popular memory storage devices because they store information in the absence of continuous power and are capable of being constructed in a very compact form. Flash memory is typically constructed by fabricating a plurality of floating gate transistors in a silicon substrate. A floating gate transistor is capable of storing electrical charge either on a separate gate electrode, known as a floating gate, or in a dielectric layer underlying a control gate electrode. Generally speaking, data is stored in a non-volatile memory device by the storage of an electrical charge in the floating gate.

In order to program and/or erase a flash memory, typically a complex process must be followed. For example, before erasing a particular sector, that sector must be programmed (known as "pre-programming"). Erasing and programming sectors and cells involves complex application of high voltages to the memory cells for specified periods of time and in particular sequences. Many flash memories provide embedded state machines that perform the complex programming and erasing operations automatically. These processes of programming and erasing a flash memory may take a long time to complete. A typical erase sequence can take anywhere from 0.7 seconds up to 15 seconds. To erase an entire chip can take up to 49 seconds. While programming is much faster, on the order of 7 to 300 microseconds, it is still slow compared to other memory devices. Programming an entire chip can take up to 7 seconds (including the time to verify the data). Typically, standard Dynamic Random Access Memory ("DRAM") offers access times on the order of nano-seconds, a difference between microseconds of many orders of magnitude.

This complex nature of programming and erasing flash memory devices leads to a major problem in that they do not provide sufficiently fast random access. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device that uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Recently a new type of flash memory has been developed that is capable of providing simultaneous read and write operations. This type of flash memory uses sliding bank architecture to give the flash memory the ability to perform simultaneous read and write operations. In this type of flash memory, the memory device is divided into two or more banks. Each bank includes a number of sectors and each sector includes a set of memory cells. Each bank has a respective decoder circuit that selectively receives an address from an input address buffer or from an internal address sequencer controlled by an internal state machine. The output data for each bank can be communicated to a read sense amplifier or a verify sense amplifier. The read sense amplifier connects to the output buffer while the verify sense amplifier connects to the state machine. When one bank receives a write command (program or erase), the internal state machine takes control and starts the program or erase operation. While one bank is busy with the program or erase operation, the other bank can be accessed for reading data.

For a detailed discussion of sliding bank architecture, see U.S. Pat. No. 5,867,430 entitled "BANK ARCHITECTURE FOR A NON-VOLATILE MEMORY ENABLING SIMULTANEOUS READING AND WRITING" and U.S. Pat. No. 5,847,998 entitled "NON-VOLATILE MEMORY ARRAY THAT ENABLES SIMULTANEOUS READ AND WRITE OPERATIONS", which are herein incorporated by reference.

As known to those skilled in the art, flash memory may be used to store various types of information. In general, the information can be divided into two categories, code and data. Code corresponds to program code that is used to execute various operations that the flash memory is capable of performing. Data generally corresponds to fields of data that changes more frequently than code. Because code rarely, if ever, changes in the lifetime of some devices, it is desirable to have the ability to write protect sectors that store code, while leaving some sectors unprotected. Providing a write protect function allows manufacturers to ensure that data does not mistakenly get written into a sector that is designated for code.

To that end, a need exists for a simultaneous operation flash memory that is capable of write protecting a respective sector or a group of sectors.

SUMMARY OF THE PRESENT INVENTION

The present invention discloses a simultaneous operation flash memory with selective sector write protect capability. The preferred embodiment of the present invention includes a plurality of sectors that are divided into an upper bank and a sliding lower bank. Each bank contains at least one of said sectors and the size of each bank may be adjusted during fabrication. The simultaneous flash memory is designed with circuit architecture that allows the flash memory device to be programmed to write protect respective sectors in either the upper or sliding lower bank. Thus, irrespective of which bank a particular sector is fabricated in, the simultaneous flash memory is capable of write protecting select sectors.

The simultaneous operation flash memory further includes at least one upper address decoder circuit that has an upper sector select line. During operation, each upper address decoder circuit generates a predetermined output signal on the upper sector select line in response to a predetermined set of input signals from at least one address line, as known in the art. The preferred simultaneous operation flash memory also includes at least one lower address decoder circuit that has a lower address sector select line. During operation, each upper address decoder circuit generates a predetermined output signal on the lower sector select line in response to a predetermined set of input signals from at least one address line. As such, each respective sector select line, upper or lower, is associated with at least one sector.

The preferred embodiment of the present invention also includes at least one write protect CAM that is electrically connected with a respective upper sector select line or a respective lower sector select line. As known in the art, a CAM is a content addressable memory device that can store a data value that is used by the flash memory. As previously set forth, each respective sector select line, upper or lower, is associated with at least one sector in the flash memory. Each write protect CAM is associated with a predetermined sector by way of its association with a respective decoder circuit. As previously set forth, each respective decoder circuit is associated with a respective sector, or group of sectors, in the simultaneous operation flash memory. As known in the art, decoder circuits can be associated with respective sectors in memory devices by being electrically connected with address lines that are used to decode respective sectors. During operation, if a decoder circuit is associated with a predetermined sector it will generate a predetermined output signal when the address lines that are electrically connected with the decoder circuits are selecting a respective sector.

For the purpose of the present invention, the write protect CAMS are said to be associated with a respective sector because each respective write protect CAM is selected by a predetermined decoder circuit when the decoder circuit receives predetermined input signals on address lines that are associated with a particular decoder circuit. One skilled in the art would recognize that in the preferred embodiment the write protect CAMS are not electrically connected to sectors, but are associated with a predetermined sector through their electrical connect to a predetermined decoder circuit. During operation, a selected write protect CAM generates a predetermined sector state signal if the write protect CAM is selected by a respective upper sector select line or a respective lower sector select line.

In the preferred simultaneous operation flash memory a state machine is electrically connected with each respective write protect CAM. The state machine is used to sense the state of the predetermined sector state signal if a particular write protect CAM is selected during operation. The state machine, which as known in the art controls the overall operation of flash memory, interrupts a programming operation in response to sensing a predetermined sector protect signal from the selected write protect CAM before any cells in the selected sector are programmed. As such, if an address signal is pointing to a sector in the simultaneous operation flash memory that has been setup as write protected, a write protect CAM that is associated with that particular sector will generate a sector state output signal that indicates to the state machine that the chosen sector is write protected. The state machine will not perform any programming operations that are designated as write protected by the write protect CAMS.

In another embodiment of the present invention, the simultaneous operation flash memory set forth above further comprises a plurality of small sectors that are preferentially located in the sliding lower bank. In addition, the preferred simultaneous flash memory includes a multiple sector write protect CAM that is electrically connected with at least one respective lower sector select line. The multiple sector write protect CAM further includes at least one small sector write protect CAMS that are associated with each small sector. As in the previous embodiment, each small sector write protect CAM is used to write protect a respective small sector, or a group of small sectors. As such, if a small sector write protect CAM is decoded with a select line from a lower address decoder circuit, the multiple sector write protect CAM generates a sector protect signal if said write protect CAM is selected by said respective lower sector select line.

Another preferred embodiment of the present invention discloses a method of write protecting predetermined sectors in a flash memory. In this embodiment of the present invention, a plurality of sectors are divided into an upper bank and a sliding lower bank. Each bank is associated with a predetermined amount of sectors in the simultaneous flash memory. A plurality of address signals are decoded with at least one upper address decoder circuit and at least one lower address decoder circuit. A respective upper address decoder circuit generates a predetermined output signal on an upper output select line in response to a predetermined address signal received by the upper address decoder circuit. A respective lower address decoder circuit generates a predetermined output signal on a lower output select line in response to a predetermined address signal received by the lower address decoder circuit. A respective write protect CAM is electrically connected with a respective output select line and generates a sector protect signal if the write protect CAM is programmed to protect a designated sector.

These and other features and advantages of the invention will become apparent upon consideration of the following detailed description of the presently preferred embodiments of the invention, viewed in conjunction with the appended drawings.

BRIEF DESCRIPTION OF THE DRAWINGS

FIG. 2 illustrates a table of an address scheme for decoding rows of sectors in the flash memory illustrated in FIG. 1.

FIG. 3 illustrates a table of an address scheme for decoding a column of sectors in the flash memory illustrated in FIG. 1.

FIG. 5 is a table that sets forth the preferred sector/WPCAM assignment.

DETAILED DESCRIPTION OF THE PRESENTLY PREFERRED EMBODIMENT OF THE PRESENT INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a flash memory. Although the preferred embodiment of the invention uses a supply voltage (Vcc) of 3.0 V, those skilled in the art would recognize that other supply voltage levels can be used. The invention may also be used with flash memory devices that use Fowler-Nordheim (F-N) or channel hot electron (CHE) injection for erase and programming.

Figure 1:
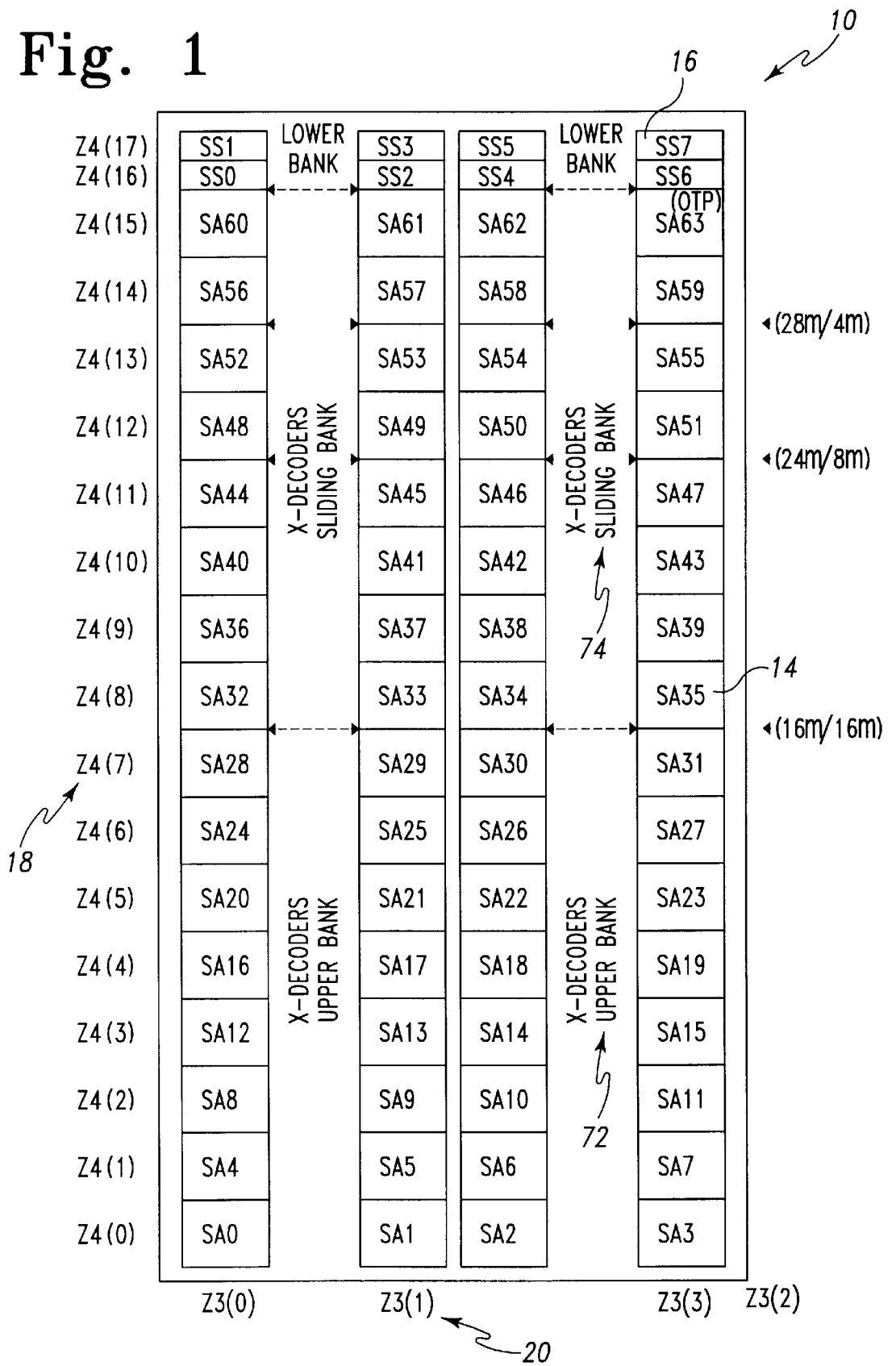
FIG. 1 illustrates a block diagram of an array of sectors in a flash memory and sector address lines associated with each sector.

Referring to FIG. 1, the present invention discloses a simultaneous operation flash memory 10 that includes a plurality of storage sectors SA0–SA63 and ss0–ss7 that may be selectively set up as read only sectors. Although not illustrated, as known in the art each storage sector includes an array of flash transistors that are arranged in rows and columns. In the present preferred embodiment, the simultaneous operation flash memory 10 includes sixty-four large sectors (SA0–SA63) 14 and eight small sectors (ss0–ss7) 16. Each respective large sector SA0–SA63 is preferentially arranged to store 512 kilobits of data. Each respective small sector ss0–ss7 16 is preferentially arranged to store 64 kilobits of data. In the present preferred embodiment of the invention, the large sectors SA0–SA63 combine to form a 32 megabit flash memory core. Those skilled in the art would recognize that other memory capacities exist such as 4, 8, 16 and 64 megabit capacities and as cell sizes decrease other higher storage capacities are envisioned. The eight small sectors ss0–ss7 combine to form a 512 kilobit storage array. Those skilled in the art will recognize that the present invention can be designed for use in any memory device with various storage capacities.

In order to understand the present invention, a general understanding of the addressing scheme used in simultaneous operation flash memory is helpful. As illustrated in FIG. 1, in the preferred embodiment each row of sectors is associated with a respective horizontal sector address line (Z4(0)–Z4(17)) 18. In addition, each column of sectors is associated with a respective vertical sector address line (Z3(0)–Z3(3)) 20. Although not illustrated in FIG. 1, those skilled in the art would recognize that the horizontal sector address lines (Z4(0)–Z4(17) 18 and the vertical address lines (Z3(0)–Z3(3)) 20 are electrically connected with decoder circuits in the simultaneous operation flash memory 10. As known in the art, a fundamental component of any memory device is the decoder circuits. In general, decoder circuits output a unique signal if, and only if, all of the bits of an address input correspond to a predetermined set of values. For the purpose of the present invention, the decoder circuits output unique electrical signals on the horizontal sector address lines (Z4(0)–Z4(17) and the vertical address lines (Z3(0)–Z3(3)) if all of the bits of an address input to the simultaneous operation flash memory 10 correspond to a predetermined set of values.

Referring to FIG. 2, a table is set forth that generally illustrates how a first set of address lines (A(20), A(19), A(18), A(17), A(16), A(15), A(12)) 22 is used by decoder circuits (not shown) to decode a respective row of sectors 12 with the horizontal address decoding lines (Z4(0)–Z4(17)) 18 illustrated in FIG. 1. As known in the art, every memory device includes a plurality of address lines that are connected with the memory device. The address lines are used to transfer electric signals from a peripheral device (not shown) to the memory device for operations such as read, program or erase. In the preferred embodiment of the present invention, the simultaneous operation flash memory 10 includes twenty-one address lines in the 32 megabit design. For the purpose of the present invention, it is only necessary to understand that the address lines are used by decoder circuits (not shown) to select a respective sector 12.

Referring to FIG. 3, a second table is set forth that generally illustrates how a second set of address lines (A(16)–A(15)) 24 is used by the simultaneous operation flash memory 10 to decode a respective column of sectors 12 with the vertical address decoding lines (Z3(0)–Z3(3)) 20 set forth in FIG. 1. As readily apparent, the second set of address lines (A(16)–A(15) 24 is a sub-set of the first set of address lines 22 set forth above. During operation, the decoder circuits (not shown) decode the electrical signals received on the first and second set of address lines 22, 24 and generate a predetermined output signal on a respective horizontal address line (Z4(0)–Z4(17)) 18 and a respective vertical address line (Z3(0)–Z3(3)) 20 that selects a predetermined sector 12.

Figure 4:
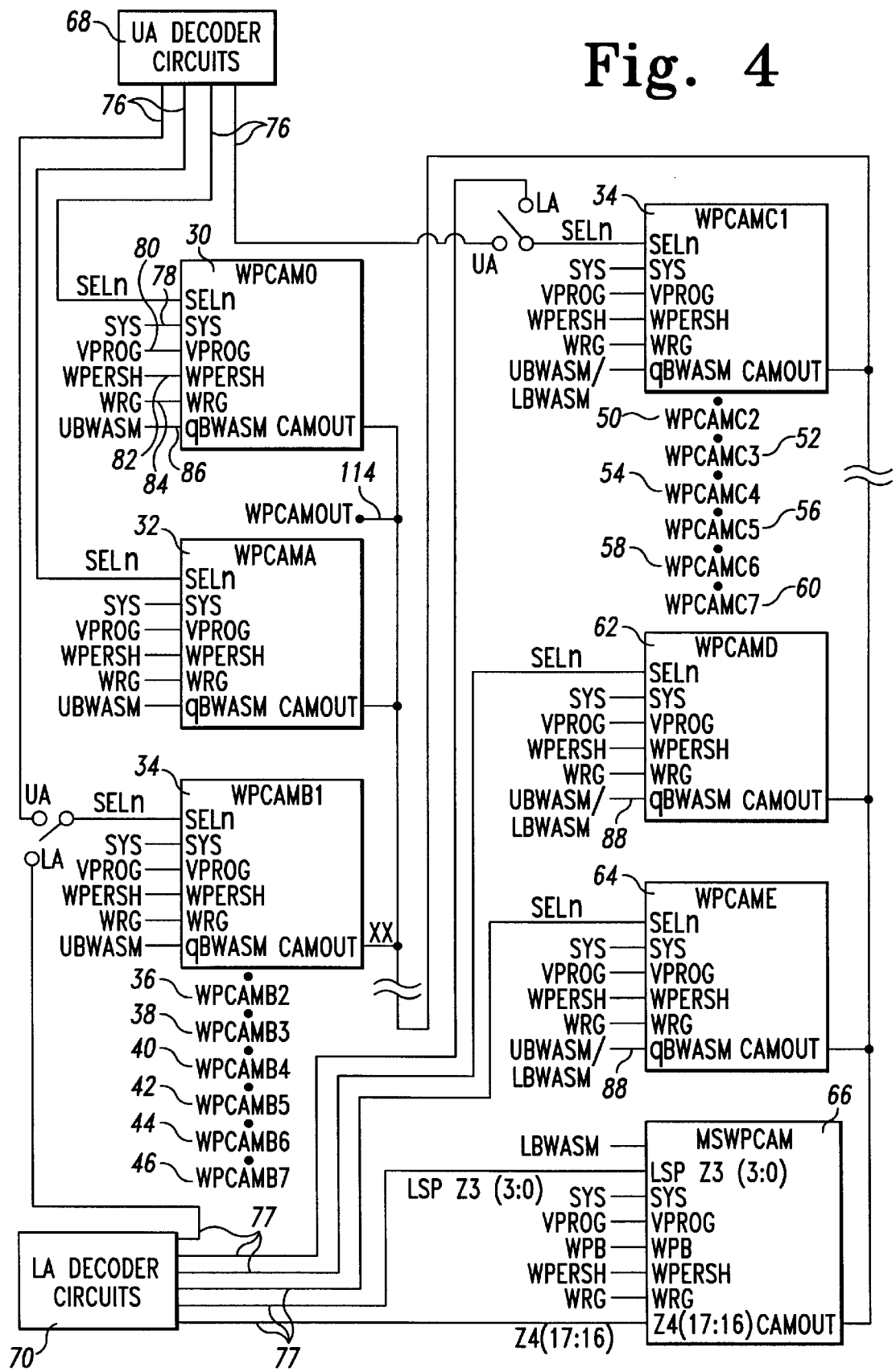
FIG. 4 sets forth a block diagram of a preferred embodiment of the present invention.

Referring to FIG. 4, a portion of the preferred simultaneous operation flash memory 10 is illustrated that incorporates a preferred embodiment of the present invention. The preferred simultaneous operation flash memory 10 includes a plurality of write protect CAMS (WPCAM) 30–64, a multiple sector WPCAM 66, at least one upper address (UA) decoder circuit 68 and at least one lower address (LA) decoder circuit 70. As known in the art, CAM stands for content addressable memory and is typically used to store various values in flash memory and for various other functions such as redundancy. For the purpose of the present invention, each respective WPCAM 30–64 is selectively programmed or erased to indicate whether or not a predetermined sector 12 is operating in a write protected state (read only) or an unprotected state (read/write). In the preferred embodiment of the present invention, if a respective WPCAM 30–64 is programmed it indicates that a particular sector 12, or group of sectors 12, is write protected, and if the respective WPCAM 30–64 is erased it indicates that the sector 12, or group of sectors 12, is unprotected.

As set forth above, the preferred flash memory includes a plurality of WPCAMS 30–64. In particular, the preferred simultaneous operation flash memory 10 includes WPCAM0 30, WPCAMA 32, WPCAMB1 34, WPCAMB2 36, WPCAMB3 38, WPCAMB4 40, WPCAMB5 42, WPCAMB6 44, WPCAMB7 46, WPCAMC1 48, WPCAMC2 50, WPCAMC3 52, WPCAMC4 54, WPCAMC5 56, WPCAMC6 58, WPCAMC7 60, WPCAMD 62 and WPCAME 64. To avoid an excessive and unnecessary illustration of redundant elements, WPCAMS 36–46 and 50–60, respectively, have only been partially illustrated in FIG. 4. As set forth in detail below, for the sake of brevity unnecessarily redundant elements have been omitted from FIG. 4.

In the preferred embodiment of the invention, each WPCAM 30–64 is associated with at least one sector, or a group of respective sectors, in the simultaneous flash memory 10. The multiple sector WPCAM 66 is associated with the small sectors ss0–ss7 14. A Table setting forth the sector/WPCAM assignments for the preferred embodiment of the present invention is set forth in FIG. 5, as it relates to the sector arrangement set forth in FIG. 1. Those skilled in the art will recognize that the arrangement set forth in the preferred embodiment of the present invention could vary in alternative embodiments and that some of the sectors in the simultaneous operation flash memory 10 may not be assigned to any WPCAM. As such, the sector/WPCAM assignments set forth in FIG. 5 should not be construed as a limitation of the present invention.

As previously set forth, the preferred embodiment of the present invention is designed for simultaneous operation flash memory 10 that uses sliding bank architecture to allow simultaneous read and write operations to be performed. Referring to FIG. 1, the design of simultaneous operation flash memory 10 with sliding bank architecture varies depending on the size of the particular memory device. Simultaneous operation flash memory 10 with sliding bank architecture is typically divided into two banks, an upper bank 72 and a sliding lower bank 74. Depending on the design chosen during manufacturing, each bank 72, 74 contains a predetermined amount of storage capacity. As illustrated in FIG. 1, in the preferred embodiment of the present invention the simultaneous operation flash memory 10 can be divided into a 16 megabit upper bank and a 16 megabit sliding lower bank, a 24 megabit upper bank and a 8 megabit sliding lower bank or a 28 megabit upper bank and a 4 megabit sliding lower bank.

As set forth above, depending on the design setup during fabrication, the simultaneous operation flash memory 10 includes at least two banks 72, 74 that contain a predetermined amount of storage capacity. For the purpose of the present invention, the simultaneous operation flash memory 10 will be set forth assuming that the simultaneous operation flash memory 10 has been fabricated to have a 16 megabit upper bank 72 and a 16 megabit sliding lower bank 74. This bank configuration is set forth for illustrative purposes only and should not be construed as a limitation of the present invention. Those skilled in the art would recognize that several bank capacities exist and that the present invention may be incorporated into these configurations.

Referring back to FIG. 4, the configuration of the upper bank 72 and the sliding lower bank 74 dictates how the WPCAMS 30–64 are selected with electric signals from a plurality of upper sector select lines (USELn) 76 from the UA decoder circuits 68 or a plurality of lower sector select lines (LSELn) 77 from the LA decoder circuits 70. Since the present invention is designed for simultaneous operation flash memory 10, the UA decoder circuits 68 are used to select sectors in the upper bank 72 and the LA decoder circuits 70 are used to select sectors in the lower bank 74. As such, if a write operation is being performed in the lower bank 74, the upper bank 72 will be available for read operations until the write operation is complete in the lower bank 74.

Referring to FIG. 4, each respective WPCAM 30–64 is electrically connected with either the UA decoder circuits 68 or the LA decoder circuits 70, which varies depending on the setup of the upper bank 72 and the sliding lower bank 74. In the preferred embodiment of the present invention, if a respective WPCAM 30–64 is associated with the upper bank 72 it is decoded using UA decoder circuits 68. If a WPCAM 30–64 is associated with the sliding lower bank 74 it is decoded using LA decoder circuits 70.

For illustrative purposes only, a detailed discussion of the address connections used in the 16 megabit upper and sliding lower bank 72,74 configuration discussed above is set forth below. Referring generally to FIGS. 4 and 5, in this configuration sectors SA0–SA31 are associated with the upper bank 72 and sectors SA32–SA63 are associated with the sliding lower bank 74. As such, the UA decoder circuits 68 are used to decode WPCAMS 30–46 and the lower address decoder circuit 70 is used to decode WPCAMS 48–64. Referring to FIGS. 2 and 3, those skilled in the art would recognize the address lines 22,24 used by the UA decoder circuit 68 and the LA decoder circuit 70 to select a respective sector, or group of sectors, in the preferred simultaneous operation flash memory 10. Which respective decoder circuits 68, 70 the address lines 22,24 are associated with is chosen depending on the configuration of the upper and sliding lower bank 72,74.

As known in the art, decoder circuits are a fundamental component of any memory device. Decoder circuits are used to enable a selected device if a set of address input signals received by the decoder circuit equals a predetermined set of values. For the purpose of the present invention those skilled in the art would recognize that several decoder circuits exist and may be used in the present invention. Although only one UA decoder circuit 68 block and one lower address decoder circuit 70 block is illustrated in FIG. 4, those skilled in the art would recognize that several smaller decoder circuits would typically be used to decode a respective sector, or row of sectors, in the simultaneous operation flash memory 10.

As illustrated in FIG. 4, a plurality of control lines 78–88 is electrically connected with each respective WPCAM 30–64. In particular, each respective WPCAM 30–64 includes CAM program line (SYS) 78, programming voltage line (VPROG) 80, CAM erase line (WPERSH) 82, CAM gate bias line (WRG) 84, upper bank select line (UBWASM) 86 or lower bank select line (LBWASM) 88. As set forth in detail below, each control line 78–88 is used during operation of the simultaneous operation flash memory 10 to perform operations on a selected WPCAM 30–64 such as read, program or erase.

Figure 6:
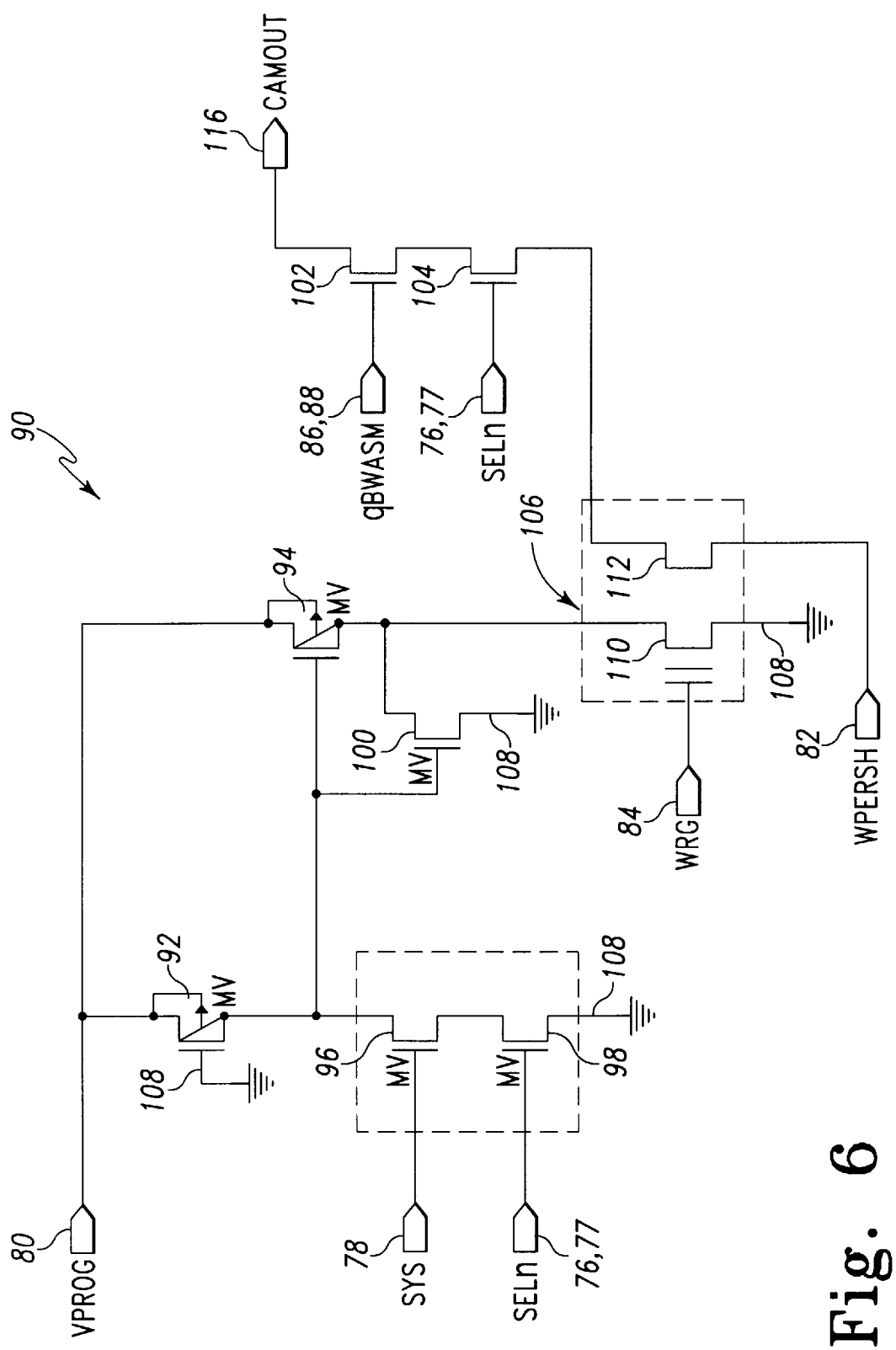
FIG. 6 is a circuit schematic of a preferred WPCAM.

Referring to FIG. 6, a detailed circuit schematic of a preferred WPCAM 90 used in the present preferred embodiment of the invention is set forth. In the preferred embodiment, each respective WPCAM 90 includes a plurality of p-channel enhancement transistors 92,94, a plurality of n-channel transistors 96–104 and a CAM cell 106 which are electrically connected as illustrated in FIG. 6. In particular, the drain of p-channel enhancement transistor 92 and p-channel enhancement transistor 94 is connected with the programming voltage line (VPROG) 80. The gate of p-channel transistor 92 is electrically connected with a ground connection 108. The source of p-channel transistor 92 is electrically connected with the drain of n-channel transistor 96, the gate of n-channel transistor 100 and the gate of p-channel enhancement transistor 94.

The gate of n-channel transistor 96 is electrically connected with the CAM program line (SYS) 78 and the source of n-channel transistor 96 is electrically connected to the drain of n-channel transistor 98. Depending on which particular sector, or group of sectors, the WPCAM 90 is associated with, dictates which respective upper sector select line (USELn) 76 or lower sector select line (LSELn) 77 is electrically connected to the gate of n-channel transistor 98. If the WPCAM 90 is setup to be associated with a sector located in the upper bank 72, a predetermined upper sector select line (USELn) 76 will be electrically connected to the gate of n-channel transistor 98. Likewise, if the WPCAM 90 is fabricated to be associated with a sector located in the lower bank 74, a predetermined lower sector select line (LSELn) 77 is electrically connected to the gate of n-channel transistor 98. In FIG. 6, (SELn) refers to the upper sector select line (USELn) 76 when the WPCAM 30–64 is electrically connected to the UA decoder circuit 68 and the lower sector select line (LSELn) 77 when the respective WPCAM 30–64 is connected to the LA decoder circuit 70.

The source of n-channel enhancement transistor 108 is electrically connected with the ground connection 108. The source of p-channel enhancement transistor 94 is connected to the CAM cell 106. In addition, the dr a in of n-channel transistor 100 is electrically connected to the CAM cell 106 and the source of n-channel transistor 100 is electrically connected with the ground connection 108.

In the preferred embodiment of the present invention, the CAM cell 106 consists of a double poly device that includes a program device 110 and a read device 112. The program device 110 is a core type flash transistor and the read device 112 is basically an intrinsic transistor, except its poly-1 is connected to the poly-1 of the program device 110. As such, when the program device 110 is programmed, the read device 112 is also programmed since its poly-1 is charged. The respective sector address line, either the upper sector address line (USELn) 76 or the lower sector address line (LSELn) 77, uses electric signals applied to the gate of n-channel transistor 98 and the gate of n-channel to select the CAM cells 106 during operation.

For the selected WPCAM 30–64, a ratio NAND gate 114, which is created by n-channel transistor 96 and n-channel transistor 98, pulls the gate of p-channel enhancement transistor 94 to ground for programming. As such, this passes a programming voltage that is on the programming voltage line 80 to the CAM cell 106, which is 5.0 V in the preferred embodiment. As set forth below, the CAM gate bias line (WRG) 84 is set at approximately 8.85 V during the programming operation. As known in the art, the se voltages are internally pumped for the WPCAMS 34–64. In the preferred embodiment, n-channel transistor 100 has been added to minimize program and read disturb of the CAM cell 106 during operation.

In the preferred embodiment of the present invention, the CAM cells 106 are program margined by applying a supply voltage (Vcc) to the CAM gate bias line (WRG) 84. In addition, the CAM cells 106 are erased margined by apply 0 V to the CAM gate bias line (WRG) 84. For erase margin, in the preferred embodiment the CAM cells 106 must be over-erased so that it is on when the CAM gate bias line (WRG) 84 is grounded. This is the equivalent to a floating gate initialization voltage of approximately 1.1 V or a CAM cell 106 Vt=−1.15 V. The CAM cells 106 can be programmed back after erase, but may require longer program time.

The source of the device read 110 is electrically connected with the CAM erase line (WPERSH) 82. The CAM erase line (WPERSH) 82 is used to apply a predetermined voltage to the WPCAMS 30–64 during an erase operation. The CAM erase line (WPERSH) 82 is grounded in all other operating modes in the preferred embodiment. When a respective WPCAM 30–64 is erased, approximately −9.0 V is supplied to the source of the device read 112, while at the same time pulsing a negative voltage on the CAM gate bias line (WRG) 84. This creates an erase field that electrically erases a respective WPCAM 30–64. The electric signals generated on the CAM erase line (WPERSH) 82 are generated with a test logic circuit (not shown) that is used to control various test modes such as erasing and programming the WPCAMS 30–64.

During the programming operation, predetermined electric signals are sent to a respective sector address line (SELn) 76 and the CAM program line (SYS) 78 thereby enabling a pull-down path to the ground connection 108. This causes the programming voltage that is applied to the programming voltage line (VPROG) 80 to be passed to the drain of the program device 110. The electric signals that are sent to the WPCAM 30–64 on the CAM program line (SYS) 78 are generated by the test logic circuit (not shown), which is used to program and erase respective WPCAMS 30–64.

As set forth in FIG. 6, the CAM gate bias voltage line (WRG) 84 is electrically connected with the gate of the device program 110. In general, the CAM gate bias voltage line (WRG) 84 supplies the gate voltage of the device program 110 during different modes. In the preferred embodiment, the CAM gate bias voltage line (WRG) 84 is set at the supply voltage (Vcc) during read, around 9 V during programming, or around −9 V during the erase operation. Although not illustrated, the CAM gate bias voltage line (WRG) 84 is electrically connected with a CAM cell gate voltage control circuit that generates the operational voltages set forth above during each respective operation. Those skilled in the art would recognize that various circuits exist that could generate the operational voltages set forth above depending on the respective operation.

As previously set forth, the preferred simultaneous operation flash memory 10 is formed using a sliding bank architecture that divides the simultaneous operation flash memory 10 into at least two banks 72,74 of sectors that are independently addressed so that simultaneous operations can be performed on each bank 72,74. More particularly, while a program or erase operation is being performed in one respective bank 72, 74, a read operation may be performed using the other bank 72, 74. Referring to FIG. 1, as previously set forth the preferred simultaneous operation flash memory 10 is divided into an upper bank 72 and a sliding lower bank 74. As such, in order to decode a respective WPCAM 30–64, an electric signal is sent to the selected WPCAM 30–64 on the sector select line (SELn) 76 after being decoded by the UA decoder circuits 68 or the LA decoder circuits 70. As previously set forth, each WPCAM 30–64 is assigned to a sector that falls in either the upper bank 72 or the sliding lower bank 74 depending on the chosen setup during manufacturing.

Referring to FIG. 6, each respective WPCAM 30–64 is electrically connected with an upper bank select line (UBWASM) 86 or a lower bank select line (LBWASM) 88. The bank select lines (UBWASM or LBWASM) 86,88 are used, in combination with a respective sector address line (USELn or LSELn) 76, 77, to decode respective WPCAMS 30–64 falling in either the upper bank 72 or the sliding lower bank 74 depending on the setup of the simultaneous operation flash memory 10. As such, either the upper bank select line (UBWASM) 86 or the lower bank select line (LBWASM) 88 is active when the corresponding bank 72,74 is selected by external addresses during a chip write, program or erase operation. For example, when external addresses given by users are pointing to a select upper bank 72, the upper bank select line (UBWASM) 86 will be conducting (logic "1"), and the lower bank select line (LBWASM) 88 will be non-conducting (logic "0"). In FIG. 6, (qBWASM) refers to the upper bank select line (UBWASM) 86 when the respective WPCAM 30–64 is associated with the upper bank 72 and the lower bank select line (LBWASM) 88 when the respective WPCAM 30–64 is associated with the lower bank 74.

Referring generally to FIGS. 4–6, in the preferred embodiment set forth for illustrative purposes, which has a 16 megabit upper bank 72 and a 16 megabit sliding lower bank 74, the WPCAM setup would be as follows for the bank select lines 86,88. The upper bank select line (UBWASM) 86 would be electrically connected to WPCAMS 30–46 and the lower bank select line (LBWASM) 88 would be electrically connected to WPCAMS 48–64. As such, during operation if a sector is selected that falls in the upper bank 72, the upper bank select line (UBWASM) 86 will be conducting and the lower bank select line (LBWASM) 88 will be non-conducting.

In the preferred embodiment illustrated in FIG. 4, WPCAM0 30 is electrically connected with the upper bank select line (UBWASM) 86 as it is associated with sector SA0, which falls in the upper bank 72 in this preferred embodiment. In addition, since WPCAMA 32 is associated with sectors SA1–SA3, which also fall in the upper bank 72, the upper bank select line (UBWASM) 86 is also electrically connected with WPCAMA 32. As readily apparent to those skilled in the art, WPCAMB1 through WPCAMB7 (34–46), WPCAMC1 through WPCAMC7 (48–60), WPCAMD 62 and WPCAME 64, would either be electrically connected with the upper bank select line (UBWASM) 86 or the lower bank select line (LBWASM) 88 depending on the setup of the simultaneous operation flash memory 10 during fabrication.

Referring once again to FIGS. 4 and 6, each respective WPCAM 32–64 includes a WPCAM output line 114 that is used to pass the data stored in a selected CAM cell 106 to a state machine (not shown). In the preferred embodiment, each WPCAM output line 116 is electrically connected with one another to form a common WPCAM output line 116. As previously set forth, each respective WPCAM 30–64 is used in the preferred embodiment to set a predetermined number of sectors or a group of sectors as protected (read only) or unprotected (read/write). As such, if a program command is entered in the simultaneous operation flash memory 10 designating a portion of memory that is located in a sector that has been setup as protected by a WPCAM 30–64, the WPCAM 30–64 associated with the selected sector generates a predetermined sector protect signal that is directed to the state machine indicating that the sector is read only. To that end, the sector will not be programmed by the programming operation since the selected sector has been designated as read only.

Although not illustrated, in the preferred embodiment of the present invention, the WPCAM output line 116 is electrically connected with an output buffer. For the purpose of the present invention, it is only necessary that the output buffer conditions the signal generated on the WPCAM output line 116 to be conducting (logic "1") if the sector is unprotected and non-conducting (logic "0") if the sector is protected. Those skilled in the art would recognize that several output buffers exist and may be used in the present invention.

Referring to FIG. 4, if a CAM cell 106 is used to designated a respective sector as write protected, the CAM cell 106 will be programmed in a non-conducting (logic "0") state. When a respective WPCAM 30–64 is selected during a programming operation, if the sector is designated as read only, the data stored in the CAM cell 106 will be sensed by the state machine as non-conducting (logic "0"). In addition, if a selected sector is not designated as write protected, the CAM cell 106 associated with that sector will not be programmed, thereby causing the WPCAM output line 116 of the chosen WPCAM 30–64 to be sensed by the state machine as conducting (logic "1").

Although not illustrated, in the preferred embodiment of the present invention the WPCAM output line 116 is electrically connected with the state machine by the output buffer, which as previously set forth is not illustrated. As known in the art, state machines are used to control the overall operation of flash memory. The state machine interprets command sets and executes a plurality of operations within the simultaneous operation flash memory 10 in response to the command sets. In the preferred embodiment of the present invention, the state machine uses the signal applied to the WPCAM output line 116 to determine if a respective sector is write protected.

During operation, if the state machine receives a command set that indicates data is to be written or programmed in a particular sector, a predetermined sector protect signal will be generated on the WPCAM output line 116 that can be sensed by the state machine. If the WPCAM 30–64 is programmed to designate a particular sector as read only, the state machine will not program any of the cells contained in that respective sector. As such, the state of each respective WPCAM 30–64 is used by the state machine to determine if a programming operation is to be performed on a selected sector. Those skilled in the art would recognize that the simultaneous operation flash memory 10 could be designed to write protect a respective sector if the CAM cell 106 is programmed or not programmed.

Figure 7:
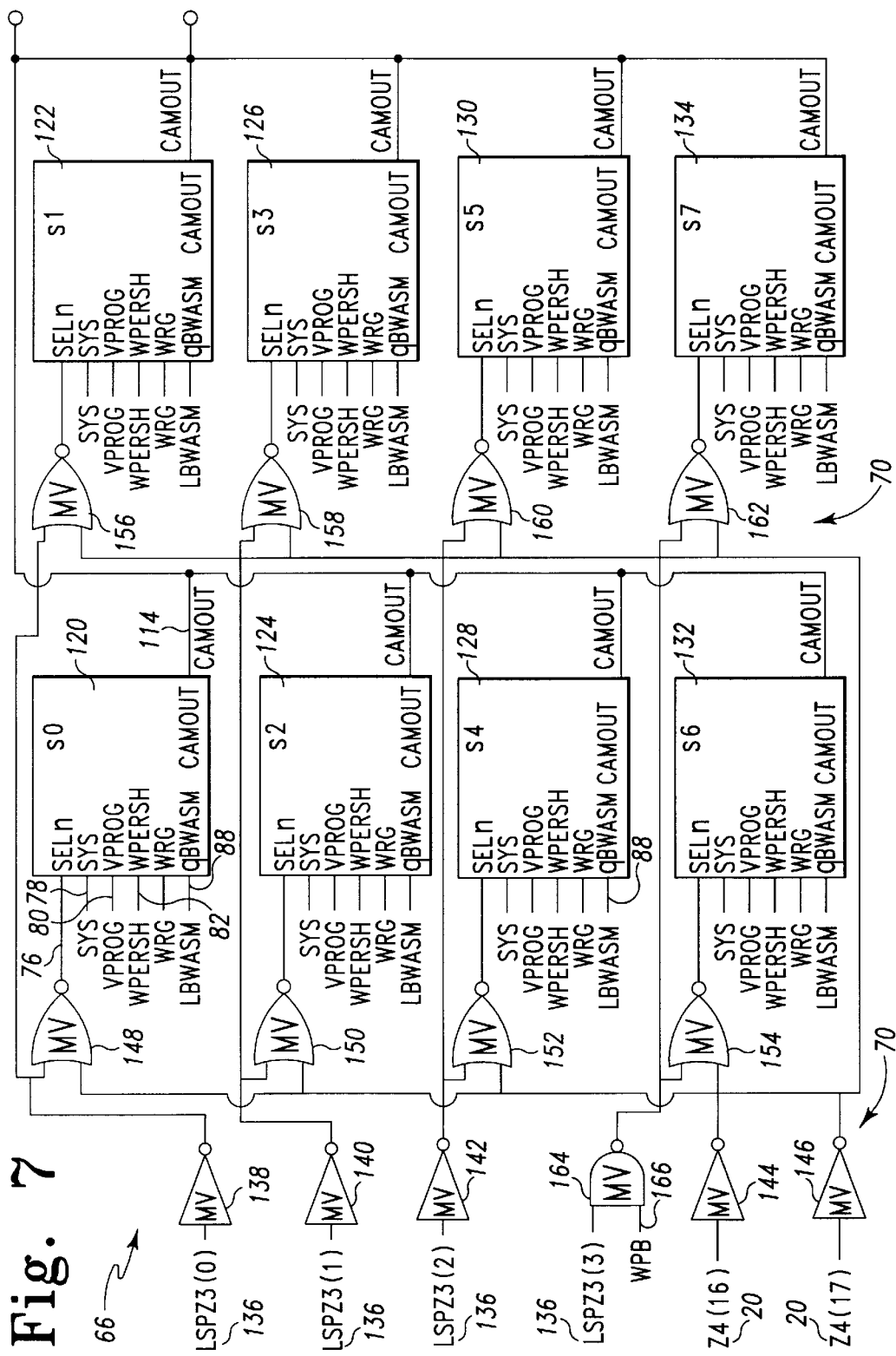
FIG. 7 is a circuit schematic of a preferred multiple sector WPCAM.

Referring to FIG. 7, a detailed circuit schematic of a preferred multiple sector WPCAM 66 and a plurality of lower address decoder circuits 70 is illustrated. The preferred multiple sector WPCAM 66 includes a plurality of small sector WPCAMS (s0–s7) 120–134. As previously set forth, the preferred simultaneous operation flash memory 10 includes a plurality of small sectors (ss0–ss7) 16 that make up a 512 k flash transistor array. Each respective small sector (ss0–ss7) 16 can also be write protected using the present invention and each small sector WPCAM (s0–s7) 120–134 functions the same as the WPCAMS 30–64 previously set forth in FIG. 6.

As illustrated in FIG. 7, in the preferred embodiment of the invention a lower sector select line (LSELn) 77, a CAM program line (SYS) 78, a programming voltage line (VPROG) 80, a CAM erase line (WPERSH) 82, a CAM gate bias line (WRG) 84 and a lower bank select line (LBWASM) 88 is electrically connected with each respective small sector WPCAM (s0–s7) 120–134. In the preferred embodiment of the present invention, the small sectors 16 are located in the sliding lower bank 74, and as such, are each decoded with the lower bank select line (LBWASM) 88. However, from a practical standpoint, each small sector WPCAM (s0–s7) operates like the WPCAMS 30–64 set forth above. As such, in order to avoid unnecessary discussion of redundant operating specifications, a detailed discussion of how the small sector WPCAMs (s0–s7) function has been omitted. In addition, although the small sectors (ss0–ss7) 16 are located in the lower bank 74 in the preferred embodiment, those skilled in the art would recognize that the small sectors (ss0–ss7) may be located in the upper bank 72 as well.

For illustrative purposes only, a plurality of lower address decoder circuits 70 are set forth in FIG. 7. The lower address decoder circuits 70 include a plurality of pre-decoded horizontal lower bank address lines (LSPZ3(0)–LSPZ3(3)) 136, the vertical address lines (Z4(16)–Z4(17)) 20, a plurality of inverters 138–146, a plurality of NOR gates 148–162 and a NAND gate 164 which are electrically connected as illustrated in FIG. 7. As readily apparent to those skilled in the art, if pre-decoded horizontal lower address line (LSPZ3(0)) 136 is selected, as well as vertical address line (Z4(16)) 20, small sector (s0) 120 is selected by the decoder circuit 70. In addition, a write protect bar line (WPB) 166 is electrically connected with an input NAND gate 164 that is used to make the last two small sectors (ss6–ss7) write protected even if the simultaneous operation flash memory 10 was operating in temporary unprotected mode. To that end, the present invention also discloses a method of write protecting a plurality of small sectors ss0–ss7 as well as a plurality of large sectors SA0–SA63.

Another preferred embodiment of the present invention discloses a method of write protecting predetermined sectors in a simultaneous operation flash memory 10. In this embodiment of the present invention, a plurality of sectors is divided into an upper bank 72 and a sliding lower bank 74. Each bank 72,74 is associated with a predetermined amount of sectors in the simultaneous operation flash memory 10. A plurality of address lines 22 are decoded with at least one UA decoder circuit 68 and at least one LA decoder circuit 70. In response to address signals received by the decoder circuits 68, 70 on the address lines 22, a respective UA decoder circuit 68 or a respective LA decoder circuit 70 generates a predetermined output signal. The output signal generated by either the UA decoder circuit 68 or the LA decoder circuit 70 is directed to a respective WPCAM 30–64 on either an upper output select line (USELn) 76 or a lower output select line (LSELn) 77. A respective write protect CAM 30–64 is electrically connected with each output select line 76,77 and generates a sector protect signal if the decoded write protect CAM 30–64 is programmed to protect a sector or a group of sectors.

It is to be noted that suitable transistor sizes specifying channel width to length ratios (measured in micrometers or microns) for the transistors that make up the circuits used in the present invention have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

Although the detailed description describes embodiments using a flash EPROM with a sliding back architecture, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A simultaneous operation flash memory capable of write protecting predetermined sectors, comprising:

a plurality of sectors divided into an upper bank and a sliding lower bank, wherein each said bank contains at least one sector;

at least one upper address decoder circuit including a respective upper sector select line, wherein each said upper address decoder circuit generates a predetermined output signal on said upper sector select line when decoded;

at least one lower address decoder circuit including a lower address sector select line, wherein each said upper address decoder circuit generates a predetermined output signal on said lower sector select line when decoded; and at least one write protect CAM electrically connected with a respective upper sector select line or a respective lower sector select line, wherein said write protect CAM generates a predetermined sector protect signal if said write protect CAM is selected by a signal from said respective upper sector select line or said respective lower sector select line.

2. The simultaneous operation flash memory of claim 1, further comprising a state machine electrically connected with said write protect CAM for sensing said sector protect signal, wherein said state machine interrupts a programming operation in response to sensing a predetermined sector protect signal.

3. The simultaneous operation flash memory of claim 1, wherein said upper address decoder circuit is associated with a respective sector in said upper bank.

4. The simultaneous operation flash memory of claim 1, wherein said upper address decoder circuit is associated with a respective group of sectors in said upper bank.

5. The simultaneous operation flash memory of claim 1, wherein said lower address decoder circuit is associated with a respective sector in said low er bank.

6. The simultaneous operation flash memory of claim 1, wherein said lower address decoder circuit is associated with a respective group of sectors in said sliding lower bank.

7. The simultaneous operation flash memory of claim 1, wherein each said write protect CAM includes a CAM cell having a device program and a device read.

8. The simultaneous operation flash memory of claim 1, further comprising a plurality of small sectors located in said sliding lower bank.

9. The simultaneous operation flash memory of claim 1, further comprising a multiple sector write protect CAM electrically connected with a respective decoder circuit, wherein said multiple sector write protect CAM generates a predetermined sector protect signal if said write protect CAM is selected by said respective lower sector select line.

10. The simultaneous operation flash memory of claim 9, wherein said multiple sector write protect CAM includes a second set of write protect CAMS.

11. The simultaneous operation flash memory of claim 10, wherein each said write protect CAM in said second set of write protect CAMS is associated with a predetermined small sector.

12. The simultaneous operation flash memory of claim 10, wherein each said write protect CAM in said second set of write protect CAMS is associated with a predetermined group of small sectors.

13. A simultaneous operation flash memory with a plurality of sectors divided into an upper bank and a sliding lower bank, wherein each said sector is capable of being write protected, comprising:

at least one upper address decoder circuit having at least one upper sector select line for generating an upper output signal if said respective decoder circuit is decoded during operation, each said upper address decoder circuit being associated with at least one respective sector in said upper bank of sectors;

at least one lower address decoder circuit having at least one lower sector select line for generating an lower output signals if said decoder circuit is decoded during operation, each said lower address decoder circuit is associated with said lower bank of sectors; and a plurality of write protect CAMS electrically connected with a respective upper sector select line or a respective lower sector select line, wherein each said write protect CAM further includes a CAM output line that generates a sector protect signal if a respective sector is write protected.

14. The simultaneous operation flash memory of claim 13, further comprising a state machine electrically connected with said write protect CAMS for sensing said sector protect signal, wherein said state machine interrupts a programming operation in response to sensing a predetermined sector protect signal.

15. The simultaneous operation flash memory of claim 13, further comprising a plurality of small sectors located in said sliding lower bank.

16. The simultaneous operation flash memory of claim 15, further comprising a multiple sector write protect CAM electrically connected with a respective decoder circuit, wherein said multiple sector write protect CAM generates a predetermined sector protect signal if said write protect CAM is selected by said respective lower sector select line.

17. The simultaneous operation flash memory of claim 16, wherein said multiple sector write protect CAM includes a second set of write protect CAMS.

18. The simultaneous operation flash memory of claim 17, wherein each said write protect CAM in said second set of write protect CAMS is associated with a predetermined small sector.

19. The simultaneous operation flash memory of claim 17, wherein each said write protect CAM in said second set of write protect CAMS is associated with a predetermined group of small sectors.

20. A method of write protecting predetermined sectors in a flash memory, comprising the steps of:

dividing a plurality of sectors into an upper bank and a sliding lower bank, wherein each said bank is associated with a predetermined amount of sectors in said memory device;

decoding a plurality of address signals with at least one upper address decoder circuit and at least one lower address decoder circuit;

generating an output signal with a respective decoder circuit if a predetermined set of address input signals received by said decoder circuits equals a predetermined set of values; and directing said output signal to a respective write protect CAM electrically connected with said respective decoder circuit, wherein said write protect CAM generates a sector protect signal if said write protect CAM is programmed to protect a designated sector.

21. The method of claim 20, further comprising the step of sensing said sector protect signal with a state machine.

22. The method of claim 21, further comprising the step of interrupting a programming operation if said write protect CAM is designated to protect said designated sector.

* * * * *